United States Patent
Busser

(10) Patent No.: US 9,921,272 B2
(45) Date of Patent: Mar. 20, 2018

(54) SYSTEM FOR DETERMINING A DISCHARGE POWER LIMIT VALUE AND A CHARGE POWER LIMIT VALUE OF A BATTERY CELL

(71) Applicant: LG Chem, Ltd., Seoul (KR)

(72) Inventor: Robert Dale Busser, West Bloomfield, MI (US)

(73) Assignee: LG Chem, Ltd., Seoul (KR)

( * ) Notice: Subject to any disclaimer, the term of this patent is extended or adjusted under 35 U.S.C. 154(b) by 177 days.

(21) Appl. No.: 15/161,438

(22) Filed: May 23, 2016

(65) Prior Publication Data

US 2017/0336479 A1  Nov. 23, 2017

(51) Int. Cl.
  *G01R 31/36* (2006.01)
  *H02J 7/00* (2006.01)
  *G06F 11/30* (2006.01)

(52) U.S. Cl.
  CPC ..... *G01R 31/3658* (2013.01); *G01R 31/3648* (2013.01); *H02J 7/0029* (2013.01); *H02J 2007/004* (2013.01)

(58) Field of Classification Search
  CPC .................................................. G01R 31/3658
  See application file for complete search history.

(56) References Cited

U.S. PATENT DOCUMENTS

| | | | |
|---|---|---|---|
| 7,750,505 B2 | 7/2010 | Ichikawa | |
| 8,008,801 B2 | 8/2011 | Fujino et al. | |
| 8,655,524 B2 * | 2/2014 | Ichikawa | B60K 6/48 701/22 |
| 8,798,826 B2 | 8/2014 | Ichikawa | |
| 2005/0099154 A1 * | 5/2005 | Ohnuma | H02J 7/0091 320/107 |
| 2013/0264975 A1 | 10/2013 | Kaita et al. | |
| 2016/0064927 A1 | 3/2016 | Smith | |

FOREIGN PATENT DOCUMENTS

| | | |
|---|---|---|
| JP | 2010093871 | 4/2010 |
| JP | 2011030362 | 2/2011 |
| JP | 2011066972 | 3/2011 |
| KR | 1020070020695 | 2/2007 |

\* cited by examiner

*Primary Examiner* — Phuong Huynh
(74) *Attorney, Agent, or Firm* — Buckert Patent & Trademark Law Firm PC; John F. Buckert

(57) ABSTRACT

A system for determining a discharge power limit value and a charge power limit of the battery cell is provided. The system has a microprocessor that calculates a maximum allowed voltage drop value of the battery cell. The microprocessor calculates a first current level through the battery cell for a predetermined amount of time to obtain the maximum allowed voltage drop value. The microprocessor calculates a first discharge power limit value, if the first current level is less than or equal to a maximum allowed discharge current. The microprocessor calculates a second discharge power limit value, if the first current level is greater than the maximum allowed discharge current.

14 Claims, 8 Drawing Sheets

R0 DISCHARGE TABLE (2 SECONDS)

|       | SOC1 | SOC2 | SOC3 |
|-------|------|------|------|
| TEMP1 | R0_1 | R0_2 | R0_3 |
| TEMP2 | R0_4 | R0_5 | R0_6 |
| TEMP3 | R0_7 | R0_8 | R0_9 |

R1 DISCHARGE TABLE (2 SECONDS)

|       | SOC1 | SOC2 | SOC3 |
|-------|------|------|------|
| TEMP1 | R1_1 | R1_2 | R1_3 |
| TEMP2 | R1_4 | R1_5 | R1_6 |
| TEMP3 | R1_7 | R1_8 | R1_9 |

R2 DISCHARGE TABLE (2 SECONDS)

|       | SOC1 | SOC2 | SOC3 |
|-------|------|------|------|
| TEMP1 | R2_1 | R2_2 | R2_3 |
| TEMP2 | R2_4 | R2_5 | R2_6 |
| TEMP3 | R2_7 | R2_8 | R2_9 |

R3 DISCHARGE TABLE (2 SECONDS)

|       | SOC1 | SOC2 | SOC3 |
|-------|------|------|------|
| TEMP1 | R3_1 | R3_2 | R3_3 |
| TEMP2 | R3_4 | R3_5 | R3_6 |
| TEMP3 | R3_7 | R3_8 | R3_9 |

R1C1 DISCHARGE TABLE (2 SECONDS)

|       | SOC1   | SOC2   | SOC3   |
|-------|--------|--------|--------|
| TEMP1 | R1C1_1 | R1C1_2 | R1C1_3 |
| TEMP2 | R1C1_4 | R1C1_5 | R1C1_6 |
| TEMP3 | R1C1_7 | R1C1_8 | R1C1_9 |

R2C2 DISCHARGE TABLE (2 SECONDS)

|       | SOC1   | SOC2   | SOC3   |
|-------|--------|--------|--------|
| TEMP1 | R2C2_1 | R2C2_2 | R2C2_3 |
| TEMP2 | R2C2_4 | R2C2_5 | R2C2_6 |
| TEMP3 | R2C2_7 | R2C2_8 | R2C2_9 |

R3C3 DISCHARGE TABLE (2 SECONDS)

|       | SOC1   | SOC2   | SOC3   |
|-------|--------|--------|--------|
| TEMP1 | R3C3_1 | R3C3_2 | R3C3_3 |
| TEMP2 | R3C3_4 | R3C3_5 | R3C3_6 |
| TEMP3 | R3C3_7 | R3C3_8 | R3C3_9 |

R0 CHARGE TABLE (2 SECONDS)

|       | SOC1 | SOC2 | SOC3 |
|-------|------|------|------|
| TEMP1 | R0_1 | R0_2 | R0_3 |
| TEMP2 | R0_4 | R0_5 | R0_6 |
| TEMP3 | R0_7 | R0_8 | R0_9 |

R1 CHARGE TABLE (2 SECONDS)

|       | SOC1 | SOC2 | SOC3 |
|-------|------|------|------|
| TEMP1 | R1_1 | R1_2 | R1_3 |
| TEMP2 | R1_4 | R1_5 | R1_6 |
| TEMP3 | R1_7 | R1_8 | R1_9 |

R2 CHARGE TABLE (2 SECONDS)

|       | SOC1 | SOC2 | SOC3 |
|-------|------|------|------|
| TEMP1 | R2_1 | R2_2 | R2_3 |
| TEMP2 | R2_4 | R2_5 | R2_6 |
| TEMP3 | R2_7 | R2_8 | R2_9 |

R3 CHARGE TABLE (2 SECONDS)

|       | SOC1 | SOC2 | SOC3 |
|-------|------|------|------|
| TEMP1 | R3_1 | R3_2 | R3_3 |
| TEMP2 | R3_4 | R3_5 | R3_6 |
| TEMP3 | R3_7 | R3_8 | R3_9 |

R1C1 CHARGE TABLE (2 SECONDS)

|       | SOC1   | SOC2   | SOC3   |
|-------|--------|--------|--------|
| TEMP1 | R1C1_1 | R1C1_2 | R1C1_3 |
| TEMP2 | R1C1_4 | R1C1_5 | R1C1_6 |
| TEMP3 | R1C1_7 | R1C1_8 | R1C1_9 |

R2C2 CHARGE TABLE (2 SECONDS)

|       | SOC1   | SOC2   | SOC3   |
|-------|--------|--------|--------|
| TEMP1 | R2C2_1 | R2C2_2 | R2C2_3 |
| TEMP2 | R2C2_4 | R2C2_5 | R2C2_6 |
| TEMP3 | R2C2_7 | R2C2_8 | R2C2_9 |

R3C3 CHARGE TABLE (2 SECONDS)

|       | SOC1   | SOC2   | SOC3   |
|-------|--------|--------|--------|
| TEMP1 | R3C3_1 | R3C3_2 | R3C3_3 |
| TEMP2 | R3C3_4 | R3C3_5 | R3C3_6 |
| TEMP3 | R3C3_7 | R3C3_8 | R3C3_9 |

SYSTEM FOR DETERMINING A DISCHARGE POWER LIMIT VALUE AND A CHARGE POWER LIMIT VALUE OF A BATTERY CELL

BACKGROUND

The inventor herein has recognized a need for an improved system for determining a discharge power limit value and charge power limit value of a battery cell. In this improved system, the discharge power limit value indicates how much power can be expected from the battery cell continuously for a predetermined amount of time without exceeding a maximum allowed discharge current. The charge power limit value indicates how much power can be provided to the battery cell continuously for a predetermined amount of time without exceeding a maximum allowed charge current.

SUMMARY

A system for determining a discharge power limit value of a battery cell in accordance with an exemplary embodiment is provided. The system includes a current sensor that generates a first signal having a current value therein. The current value indicates a current level flowing through the battery cell at a first time. The system further includes a microprocessor that is programmed to receive the first signal having the first current value therein. The microprocessor is further programmed to calculate a maximum allowed voltage drop value corresponding to a difference between a voltage measured across the battery cell at the first time and a minimum allowed voltage of the battery cell. The microprocessor is further programmed to calculate a first current level through the battery cell for a predetermined amount of time that is required to obtain the maximum allowed voltage drop value, based on a first ohmic resistance value of a battery cell equivalent circuit model of the battery cell, a first predictive saturation ratio value, at least a first time-varying resistance value of the battery cell equivalent circuit model of the battery cell, and the first current value. The microprocessor is further programmed to calculate a first discharge power limit value that indicates an amount of power that can be expected from the battery cell continuously for the predetermined amount of time without the voltage measured across the battery cell falling below the minimum allowed voltage of the battery cell, if the first current level is less than or equal to a maximum allowed discharge current of the battery cell. The first discharge power limit value is based on the first current level and the minimum allowed voltage of the battery cell. The microprocessor is further programmed to calculate a second discharge power limit value that indicates the amount of power that can be expected from the battery cell continuously for the predetermined amount of time without exceeding the maximum allowed discharge current, if the first current level is greater than the maximum allowed discharge current of the battery cell. The second discharge power limit value is based on the maximum allowed discharge current of the battery cell, the voltage measured across the battery cell at the first time, the maximum allowed discharge current of the battery cell, the first ohmic resistance value of the battery cell equivalent circuit model of the battery cell, the first time-varying resistance value of the battery cell equivalent circuit model of the battery cell, and the first predictive saturation ratio value.

A system for determining a charge power limit value of a battery cell in accordance with another exemplary embodiment is provided. The system includes a current sensor that generates a first signal having a current value therein. The current value indicates a current level flowing through the battery cell at a first time. The system further includes a microprocessor that is programmed to receive the first signal having the first current value therein. The microprocessor is further programmed to calculate a first voltage gain value corresponding to a difference between a voltage measured across the battery cell at the first time and a maximum allowed voltage of the battery cell. The microprocessor is further programmed to calculate a first current level through the battery cell for a predetermined amount of time that is required to obtain the maximum allowed voltage gain value, based on a first ohmic resistance value of a battery cell equivalent circuit model of the battery cell, a first predictive saturation ratio value, at least a first time-varying resistance value of the battery cell equivalent circuit model of the battery cell, and the first current value. The microprocessor is further programmed to calculate a first charge power limit value that indicates an amount of power that can be provided to the battery cell continuously for the predetermined amount of time without the voltage measured across the battery cell exceeding the maximum allowed voltage of the battery cell, if the first current level is less than or equal to a maximum allowed charge current of the battery cell. The first charge power limit value is based on the first current level and the minimum allowed voltage of the battery cell. The microprocessor is further programmed to calculate a second charge power limit value that indicates the amount of power that can be provided to the battery cell continuously for the predetermined amount of time without exceeding the maximum allowed charge current, if the first current level is greater than the maximum allowed charge current of the battery cell. The second charge power limit value is based on the maximum allowed charge current of the battery cell, the voltage measured across the battery cell at the first time, the maximum allowed charge current of the battery cell, the first ohmic resistance value of the battery cell equivalent circuit model of the battery cell, the first time-varying resistance value of the battery cell equivalent circuit model of the battery cell, and the first predictive saturation ratio value.

BRIEF DESCRIPTION OF THE DRAWINGS

FIG. 4 is an R0 discharge table having resistance values of a first resistor in the battery cell equivalent circuit model of FIG. 2 when discharging the battery cell—utilized for determining a discharge power limit value;

FIG. 5 is an R1 discharge table having resistance values of a second resistor in the battery cell equivalent circuit model of FIG. 2 when discharging the battery cell—utilized for determining a discharge power limit value;

FIG. 6 is an R2 discharge table having resistance values of a third resistor in the battery cell equivalent circuit model of FIG. 2 when discharging the battery cell—utilized for determining a discharge power limit value;

FIG. 7 is an R3 discharge table having resistance values of a fourth resistor in the battery cell equivalent circuit model of FIG. 2 when discharging the battery cell—utilized for determining a discharge power limit value;

FIG. 8 is an R1C1 discharge table having time constant values of a parallel combination of the second resistor and the first capacitor in the battery cell equivalent circuit model of FIG. 2 when discharging the battery cell—utilized for determining a discharge power limit value;

FIG. 9 is an R2C2 discharge table having time constant values of a parallel combination of the third resistor and the second capacitor in the battery cell equivalent circuit model of FIG. 2 when discharging the battery cell—utilized for determining a discharge power limit value;

FIG. 10 is an R3C3 discharge table having time constant values of a parallel combination of the fourth resistor and the third capacitor in the battery cell equivalent circuit model of FIG. 2 when discharging the battery cell—utilized for determining a discharge power limit value;

FIG. 11 is an R0 charge table having resistance values of the first resistor in the battery cell equivalent circuit model of FIG. 2 when charging the battery cell—utilized for determining a charge power limit value;

FIG. 12 is an R1 charge table having resistance values of a second resistor in the battery cell equivalent circuit model of FIG. 2 when charging the battery cell—utilized for determining a charge power limit value;

FIG. 13 is an R2 charge table having resistance values of a third resistor in the battery cell equivalent circuit model of FIG. 2 when charging the battery cell—utilized for determining a charge power limit value;

FIG. 14 is an R3 charge table having resistance values of a fourth resistor in the battery cell equivalent circuit model of FIG. 2 when charging the battery cell—utilized for determining a charge power limit value;

FIG. 15 is an R1C1 charge table having time constant values of a parallel combination of the second resistor and the first capacitor in the battery cell equivalent circuit model of FIG. 2 when charging the battery cell—utilized for determining a charge power limit value;

FIG. 16 is an R2C2 charge table having time constant values of a parallel combination of the third resistor and the second capacitor in the battery cell equivalent circuit model of FIG. 2 when charging the battery cell—utilized for determining a charge power limit value;

FIG. 17 is an R3C3 charge table having time constant values of a parallel combination of the fourth resistor and the third capacitor in the battery cell equivalent circuit model of FIG. 2 when charging the battery cell—utilized for determining a charge power limit value.

DETAILED DESCRIPTION

Figure 1:
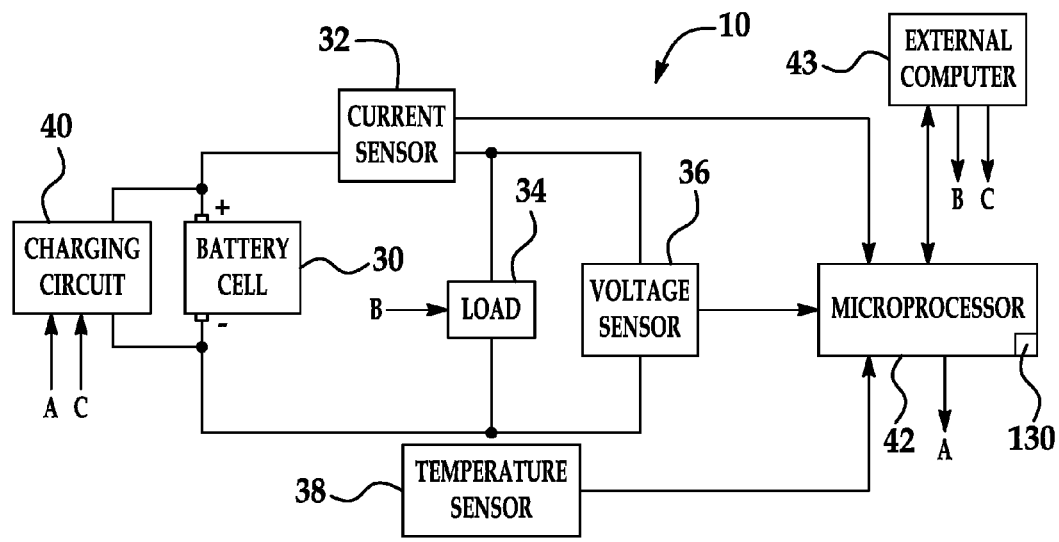
FIG. 1 is a schematic of a system for determining a discharge power limit value and a charge power limit value of a battery cell in accordance with an exemplary embodiment.

Referring to FIG. 1, a system 10 for determining a discharge power limit value of a battery cell 30, and a charge power limit value of the battery cell 30 in accordance with an exemplary embodiment is provided. The system 10 includes a battery cell 30, a current sensor 32, an electrical load 34, a voltage sensor 36, a temperature sensor 38, a charging circuit 40, a microprocessor 42, and an external computer 43. An advantage of the system 10 is that the system 10 calculates a predictive saturation ratio value based on an ohmic resistance value and time-varying resistance values of a battery cell equivalent circuit model 60 of the battery cell 30, which is used to determine the discharge power limit value of the battery cell 30 and a charge power limit of the battery cell 30. The discharge power limit value indicates an amount of power that can be expected from the battery cell 30 continuously for a predetermined amount of time without exceeding a maximum allowed discharge current of the battery cell 30. The charge power limit value indicates an amount of power that can be provided to the battery cell 30 continuously for a predetermined amount of time without exceeding a maximum allowed charge current of the battery cell 30.

Figure 2:
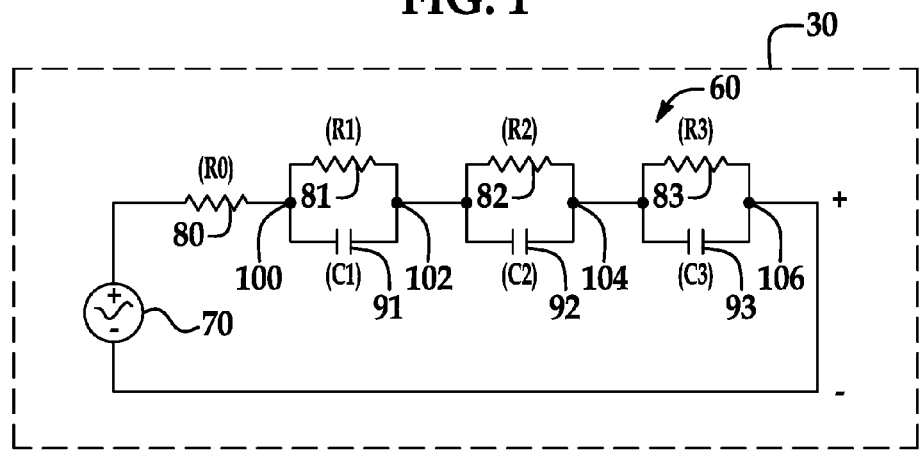
FIG. 2 is a schematic of a battery cell equivalent circuit model associated with a battery cell utilized in the system of FIG. 1.

Referring to FIGS. 1 and 2, the battery cell 30 includes a positive terminal (+) and a negative terminal (−). In an exemplary embodiment, the battery cell 30 is a pouch-type lithium-ion battery cell. Of course, in an alternative embodiment, other types of battery cells could be utilized. The battery cell 30 is mathematically modeled utilizing the battery cell equivalent circuit model 60 having a voltage source 70, resistors 80, 81, 82, 83, capacitors 91, 92, 93, and electrical nodes 100, 102, 104, 106.

The resistor 80 is coupled between the voltage source 70 and the electrical node 100. The resistor 81 and the capacitor 91 are electrically coupled parallel to one another between the electrical nodes 100, 102. The resistor 82 and the capacitor 92 are electrically coupled parallel to one another between the electrical nodes 102, 104. The resistor 83 and the capacitor 93 are electrically coupled parallel to one another between the electrical nodes 104, 106. The electrical node 106 is further coupled to the voltage source 70.

The resistor 80 has a resistance value R0 corresponding to an internal ohmic resistance value of the battery cell 30. The resistor 81 has a resistance value R1 corresponding to a first time-varying resistance value of the battery cell 30. The resistor 82 has a resistance value R2 corresponding to a second time-varying resistance value of the battery cell 30. The resistor 83 has a resistance value R3 corresponding to a third time-varying resistance value of the battery cell 30. The capacitor 91 has a capacitance value C1 corresponding to a first time-varying capacitance of the battery cell 30. The capacitor 92 has a capacitance value C2 corresponding to a second time-varying capacitance of the battery cell 30. The capacitor 93 has a capacitance value C3 corresponding to a third time-varying capacitance of the battery cell 30. The total steady state resistance of the battery cell equivalent circuit model 60 is R0+R1+R2+R3.

Figure 3:
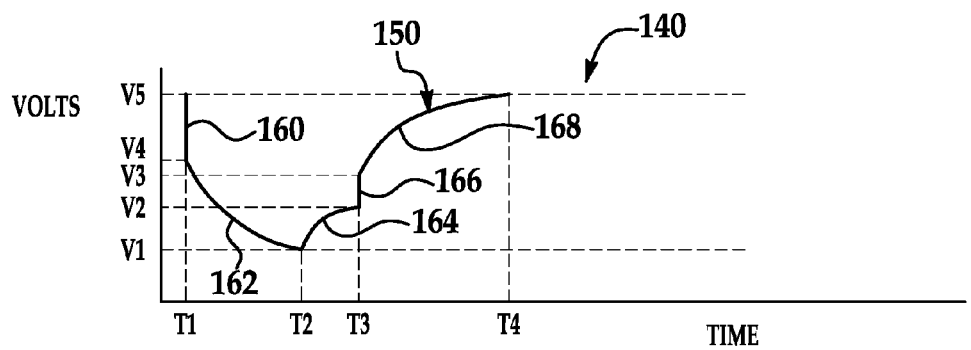
FIG. 3 is a graph of a voltage curve associated with the battery cell utilized in the system of FIG. 1 illustrating first and second discharge curve portions, a relaxation curve portion, and first and second charge curve portions.
Figure 18:
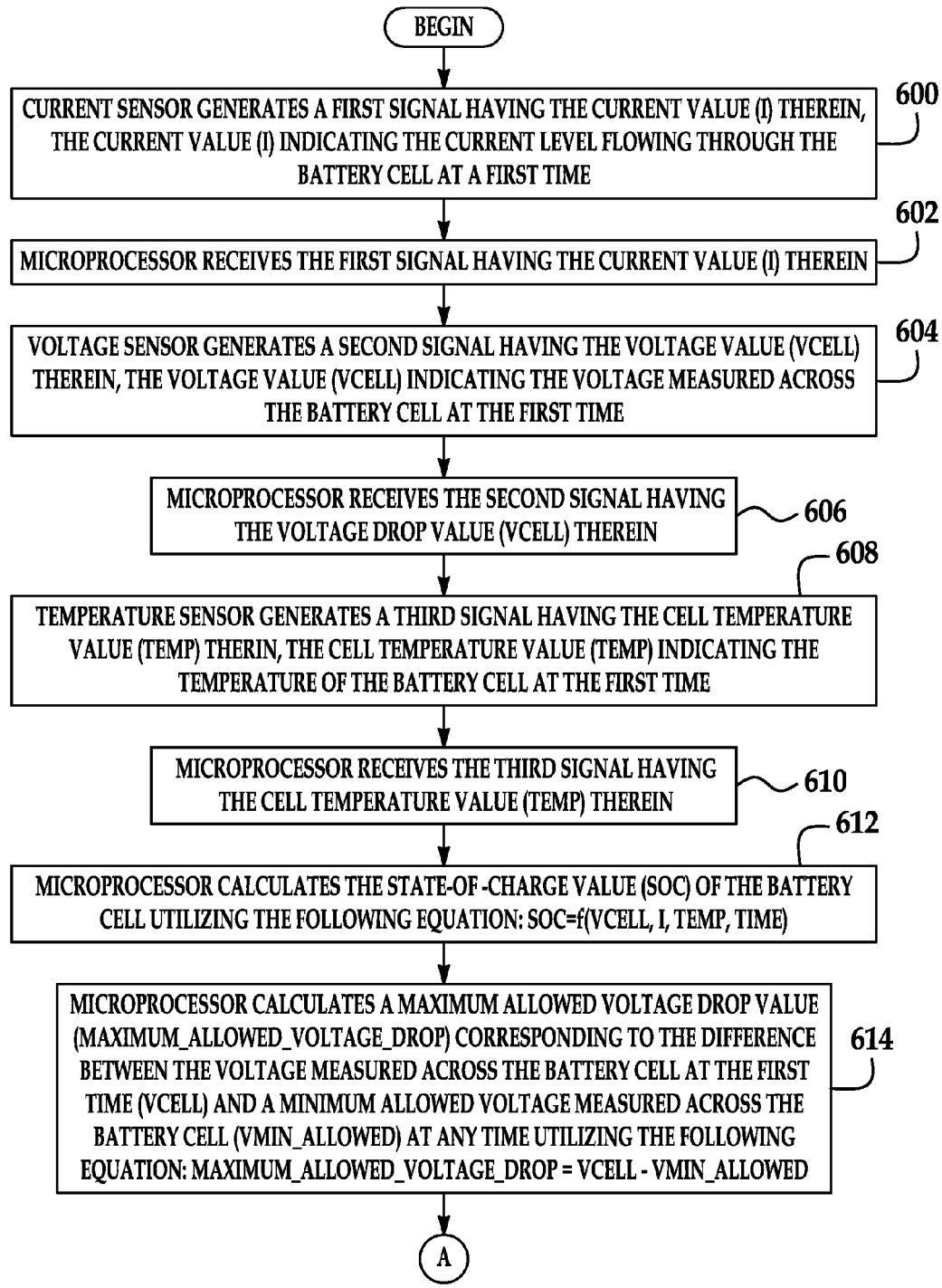
FIGS. 18-22 are a flowchart of a method for determining a discharge power limit value and a charge power limit value of a battery cell in accordance with another exemplary embodiment.
Figure 19:
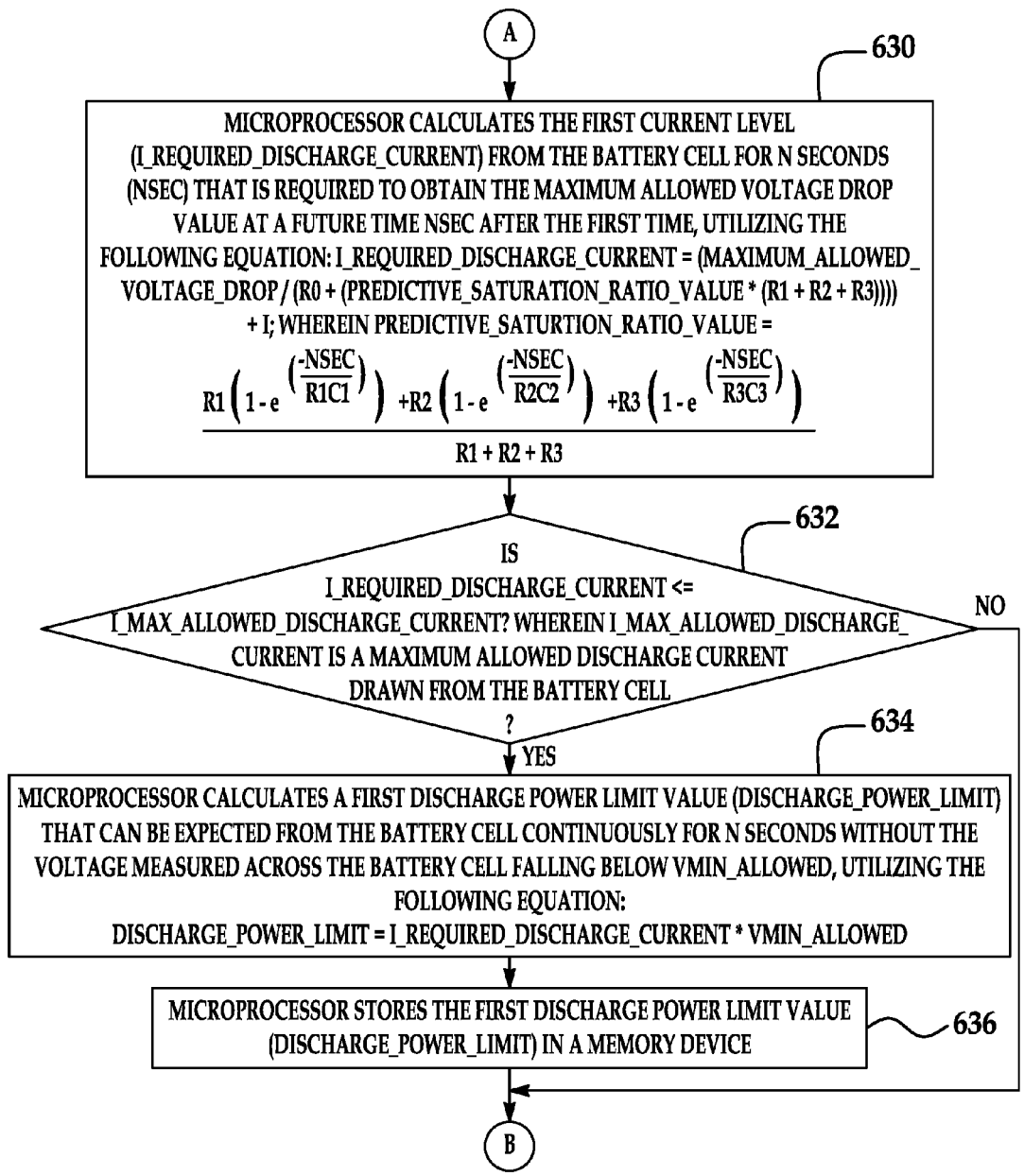
Figure 20:
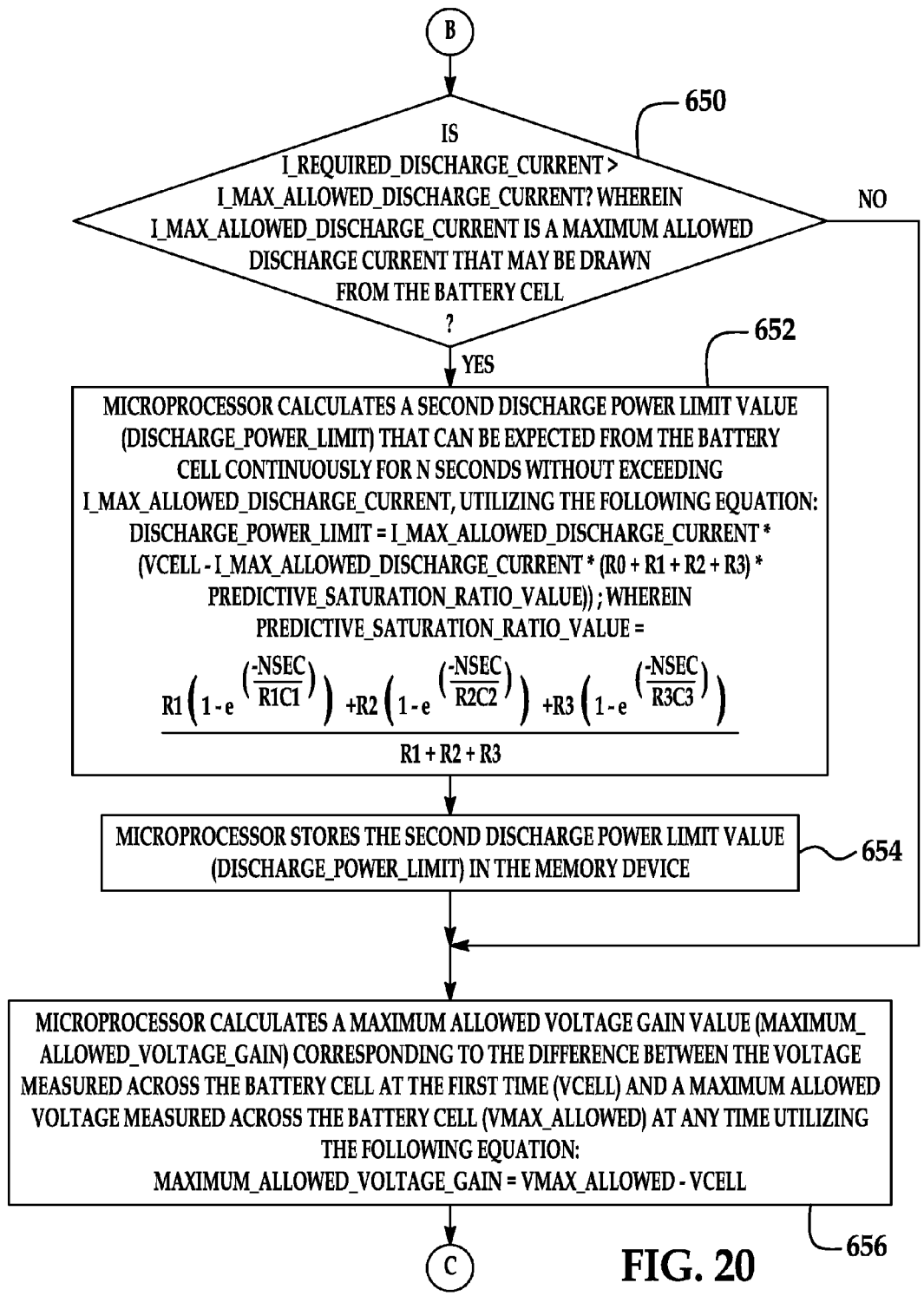
Figure 21:
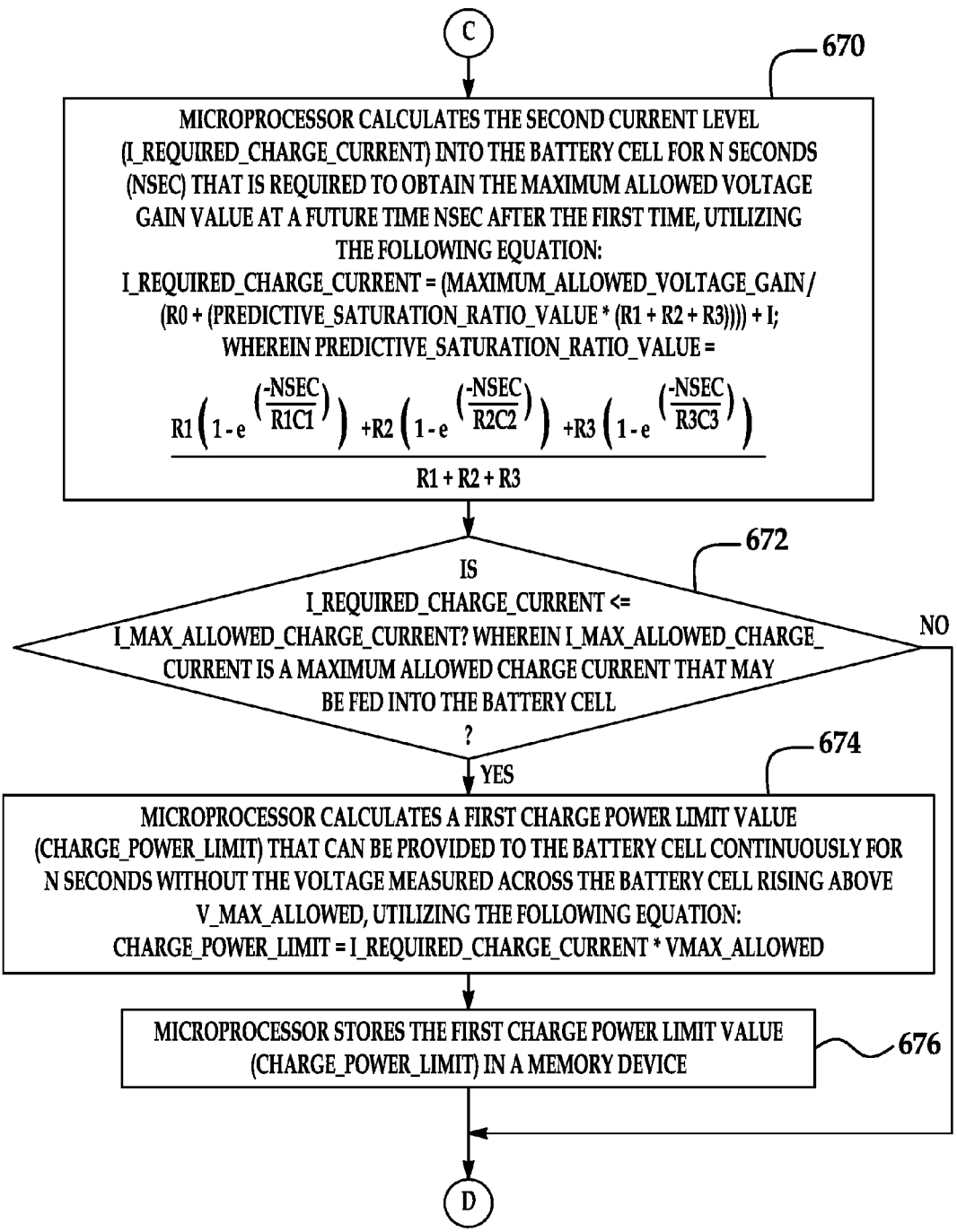
Figure 22:
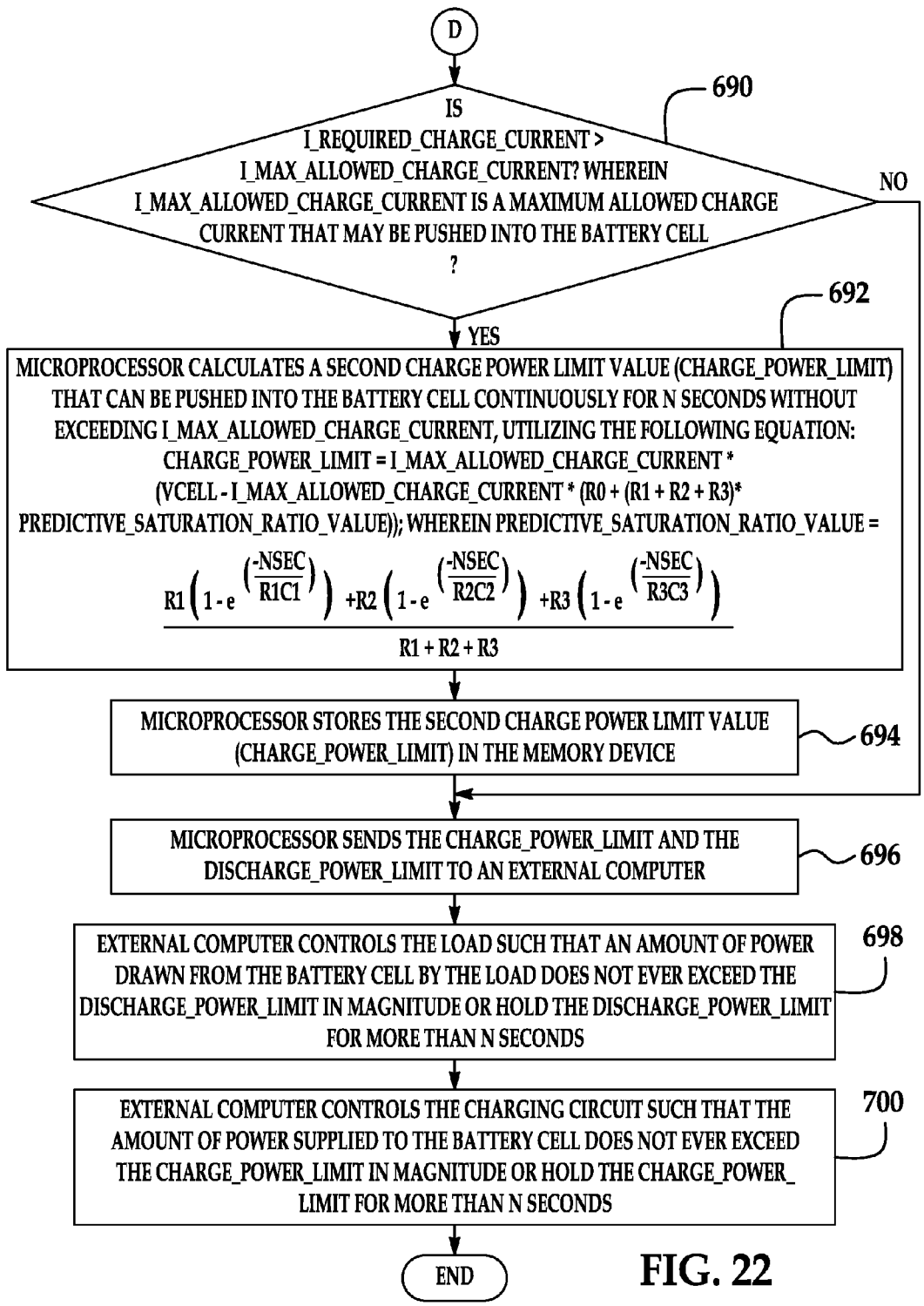

Referring to FIGS. 2 and 3, a brief explanation of a graph 140 illustrating a voltage curve 150 associated with the battery cell 30 will be provided. The voltage curve 150 includes a discharge curve portion 160, a discharge curve portion 162, a relaxation curve portion 164, a charge curve portion 166, and a charge curve portion 168. At time T1, when the battery cell 30 is being discharged, the discharge curve portion 150 illustrates the voltage drop across the resistor 80 of the battery cell 30. From time T1 to T2, as the battery cell continues to be discharged, the capacitance values C1, C2, C3 of the capacitors 91, 92, 93, respectively, and the resistance values R1, R2, R3 of the resistors 81, 82, 83, respectively, dictate the shape of the discharge curve portion 162. At time T2, the battery cell 30 has a saturation state and the capacitors 91, 92, 93 have an open operational state, and the battery cell 30 has an internal resistance corresponding to a sum of the resistance values R0, R1, R2, R3. From time T2 to T3, the battery cell 30 is no longer being discharged, and the relaxation curve portion 164 illustrates the voltage across the battery cell 30 gradually increasing. At time T3, an external charging voltage is applied to the battery cell 30 and the charge curve portion 166 illustrates the voltage gain across the resistor 80 of the battery cell 30. From time T3 to T4, the battery cell 30 is being charged, and capacitance values C1, C2, C3 of the capacitors 91, 92, 93, respectively, and the resistance values R1, R2, R3 of the resistors 81, 82, 83 respectively, dictate the shape of the discharge curve portion 162.

Referring to FIG. 1, the current sensor 32 is electrically coupled in series between the positive terminal of the battery cell 30 and the electrical load 34. The current sensor 32 is adapted to generate a signal having a current value therein that indicates a current level flowing through the battery cell 32, which is received by the microprocessor 42.

The electrical load 34 is electrically coupled between the current sensor 32 and the negative terminal of the battery cell 30. In an exemplary embodiment, the electrical load is an electric motor in which the operation (e.g., speed, torque etc.) of the electric motor is controlled by the external computer 43.

The voltage sensor 36 is electrically coupled in parallel with the electrical load 34. The voltage sensor 36 is adapted to generate a signal having a voltage value therein that indicates a voltage across the battery cell 30, which is received by the microprocessor 42.

The temperature sensor 38 is disposed proximate to the battery cell 30. The temperature sensor 38 is adapted to generate a signal having a cell temperature value therein that indicates a temperature level of the battery cell 30, which is received by the microprocessor 42.

The charging circuit 40 is provided to apply a charging voltage across the battery cell 30 to electrically charge the battery cell 30 in response to a control signal from the microprocessor 42. The charging circuit 40 is electrically coupled between the positive terminal of the battery cell 30 and the negative terminal of the battery cell 30.

The microprocessor 42 is electrically coupled to the current sensor 32, the voltage sensor 36, and the temperature sensor 38. The microprocessor 42 operably communicates with the external computer 43 via a communication bus. The microprocessor 42 includes a memory device 130 for storing data, tables, and software instructions for implementing at least a portion of the methods described hereinafter.

Referring to FIGS. 4-10, a description of the tables stored in the memory device 130 that is utilized by the microprocessor 42 for determining a discharge power limit value of the battery cell 30 for a predetermined amount of time (e.g., 2 seconds) will now be explained.

Referring to FIG. 4, the R0 discharge table 190 has resistance values associated with the resistor 80 in the battery cell equivalent circuit model 60 (shown in FIG. 2), while discharging the battery cell 30. The R0 discharge table 190 utilizes a temperature value of the battery cell 30 and a state-of-charge value of the battery cell 30 as indexes in the table 190 for retrieving resistance values associated with the resistor 80 in the battery cell equivalent circuit model 60 of the battery cell 30. For example, if the battery cell 30 has a temperature value equal to Temp1, and a state-of-charge value equal to SOC2, the microprocessor 42 would extract a resistance value R0_2 from the table 190. It is noted that the resistance values stored in the R0 discharge table 190 are empirically determined before use of the table 190.

Referring to FIG. 5, the R1 discharge table 200 has resistance values associated with the resistor 81 in the battery cell equivalent circuit model 60 (shown in FIG. 2), while discharging the battery cell 30. The R1 discharge table 200 utilizes a temperature value of the battery cell 30 and a state-of-charge value of the battery cell 30 as indexes in the table 200 for retrieving resistance values associated with the resistor 81 in the battery cell equivalent circuit model 60 of the battery cell 30. For example, if the battery cell 30 has a temperature value equal to Temp1, and a state-of-charge value equal to SOC2, the microprocessor 42 would extract a resistance value R1_2 from the table 200. It is noted that the resistance values stored in the R1 discharge table 200 are empirically determined before use of the table 200.

Referring to FIG. 6, the R2 discharge table 210 has resistance values associated with the resistor 82 in the battery cell equivalent circuit model 60 (shown in FIG. 2), while discharging the battery cell 30. The R2 discharge table 210 utilizes a temperature value of the battery cell 30 and a state-of-charge value of the battery cell 30 as indexes in the table 210 for retrieving resistance values associated with the resistor 82 in the battery cell equivalent circuit model 60 of the battery cell 30. For example, if the battery cell 30 has a temperature value equal to Temp1, and a state-of-charge value equal to SOC2, the microprocessor 42 would extract a resistance value R2_2 from the table 210. It is noted that the resistance values stored in the R2 discharge table 210 are empirically determined before use of the table 210.

Referring to FIG. 7, the R3 discharge table 220 has resistance values associated with the resistor 83 in the battery cell equivalent circuit model 60 (shown in FIG. 2), while discharging the battery cell 30. The R3 discharge table 220 utilizes a temperature value of the battery cell 30 and a state-of-charge value of the battery cell 30 as indexes in the table 220 for retrieving resistance values associated with the resistor 83 in the battery cell equivalent circuit model 60 of the battery cell 30. For example, if the battery cell 30 has a temperature value equal to Temp1, and a state-of-charge value equal to SOC2, the microprocessor 42 would extract a resistance value R3_2 from the table 220. It is noted that the resistance values stored in the R3 discharge table 220 are empirically determined before use of the table 220.

Referring to FIG. 8, the R1C1 discharge table 230 has time constant values associated with the parallel combination of the resistor 81 and the capacitor 91 in the battery cell equivalent circuit model 60 (shown in FIG. 2), while discharging the battery cell 30. The R1C1 discharge table 230 utilizes a temperature value of the battery cell 30 and a state-of-charge value of the battery cell 30 as indexes in the table 230 for retrieving time constant values associated with the parallel combination of the resistor 81 and the capacitor 91 in the battery cell equivalent circuit model 60 of the battery cell 30. For example, if the battery cell 30 has a temperature value equal to Temp1, and a state-of-charge value equal to SOC2, the microprocessor 42 would extract a time constant value R1C1_2 from the table 230. It is noted that the time constant values stored in the R1C1 discharge table 230 are empirically determined before use of the table 230.

Referring to FIG. 9, the R2C2 discharge table 240 has time constant values associated with the parallel combination of the resistor 82 and the capacitor 92 in the battery cell equivalent circuit model 60 (shown in FIG. 2), while discharging the battery cell 30. The R2C2 discharge table 240 utilizes a temperature value of the battery cell 30 and a state-of-charge value of the battery cell 30 as indexes in the table 240 for retrieving time constant values associated with the parallel combination of the resistor 82 and the capacitor 92 in the battery cell equivalent circuit model 60 of the battery cell 30. For example, if the battery cell 30 has a temperature value equal to Temp1, and a state-of-charge value equal to SOC2, the microprocessor 42 would extract a time constant value R2C2_2 from the table 240. It is noted that the time constant values stored in the R2C2 discharge table 240 are empirically determined before use of the table 240.

Referring to FIG. 10, the R3C3 discharge table 250 has constant values associated with the parallel combination of the resistor 83 and the capacitor 93 in the battery cell equivalent circuit model 60 (shown in FIG. 2), while discharging the battery cell 30. The R3C3 discharge table 250 utilizes a temperature value of the battery cell 30 and a state-of-charge value of the battery cell 30 as indexes in the table 250 for retrieving time constant values associated with the parallel combination of the resistor 83 and the capacitor 93 in the battery cell equivalent circuit model 60 of the battery cell 30. For example, if the battery cell 30 has a temperature value equal to Temp1, and a state-of-charge value equal to SOC2, the microprocessor 42 would extract a time constant value R3C3_2 from the table 250. It is noted that the time constant values stored in the R3C3 discharge table 250 are empirically determined before use of the table 250.

Referring to FIGS. 11-17, a description of the tables stored in the memory device 130 that is utilized by the microprocessor 42 for determining a charge power limit value of the battery cell 30 for a predetermined amount of time (e.g., 2 seconds) will now be explained. It should be understood that even though the resistance values and time constant values in the tables shown in FIGS. 11-17 may have the same designations as the resistance values and time constant values in the tables shown in the FIGS. 4-10, respectively, the resistance values and time constant values in the charge tables are different than the resistance values and time constant values in the discharge tables. For example, the resistance value R0_2 in the R0 charge table 390 (shown in FIG. 11) would be different than the resistance value R0_2 in the R0 discharge table 190 (shown in FIG. 4).

Referring to FIG. 11, the R0 charge table 390 has resistance values associated with the resistor 80 in the battery cell equivalent circuit model 60 (shown in FIG. 2), while charging the battery cell 30. The R0 charge table 390 utilizes a temperature value of the battery cell 30 and a state-of-charge value of the battery cell 30 as indexes in the table 390 for retrieving resistance values associated with the resistor 80 in the battery cell equivalent circuit model 60 of the battery cell 30. For example, if the battery cell 30 has a temperature value equal to Temp1, and a state-of-charge value equal to SOC2, the microprocessor 42 would extract a resistance value R0_2 from the table 390. It is noted that the resistance values stored in the R0 charge table 390 are empirically determined before use of the table 390.

Referring to FIG. 12, the R1 charge table 400 has resistance values associated with the resistor 81 in the battery cell equivalent circuit model 60 (shown in FIG. 2), while charging the battery cell 30. The R1 charge table 400 utilizes a temperature value of the battery cell 30 and a state-of-charge value of the battery cell 30 as indexes in the table 400 for retrieving resistance values associated with the resistor 81 in the battery cell equivalent circuit model 60 of the battery cell 30. For example, if the battery cell 30 has a temperature value equal to Temp1, and a state-of-charge value equal to SOC2, the microprocessor 42 would extract a resistance value R1_2 from the table 400. It is noted that the resistance values stored in the R1 charge table 400 are empirically determined before use of the table 400.

Referring to FIG. 13, the R2 charge table 410 has resistance values associated with the resistor 82 in the battery cell equivalent circuit model 60 (shown in FIG. 2), while charging the battery cell 30. The R2 charge table 410 utilizes a temperature value of the battery cell 30 and a state-of-charge value of the battery cell 30 as indexes in the table 410 for retrieving resistance values associated with the resistor 82 in the battery cell equivalent circuit model 60 of the battery cell 30. For example, if the battery cell 30 has a temperature value equal to Temp1, and a state-of-charge value equal to SOC2, the microprocessor 42 would extract a resistance value R2_2 from the table 410. It is noted that the resistance values stored in the R2 charge table 410 are empirically determined before use of the table 410.

Referring to FIG. 14, the R3 charge table 420 has resistance values associated with the resistor 83 in the battery cell equivalent circuit model 60 (shown in FIG. 2), while charging the battery cell 30. The R3 charge table 420 utilizes a temperature value of the battery cell 30 and a state-of-charge value of the battery cell 30 as indexes in the table 420 for retrieving resistance values associated with the resistor 83 in the battery cell equivalent circuit model 60 of the battery cell 30. For example, if the battery cell 30 has a temperature value equal to Temp1, and a state-of-charge value equal to SOC2, the microprocessor 42 would extract a resistance value R3_2 from the table 420. It is noted that the resistance values stored in the R3 charge table 420 are empirically determined before use of the table 420.

Referring to FIG. 15, the R1C1 charge table 430 has time constant values associated with the parallel combination of the resistor 81 and the capacitor 91 in the battery cell equivalent circuit model 60 (shown in FIG. 2), while charging the battery cell 30. The R1C1 charge table 430 utilizes a temperature value of the battery cell 30 and a state-of-charge value of the battery cell 30 as indexes in the table 430 for retrieving time constant values associated with the parallel combination of the resistor 81 and the capacitor 91 in the battery cell equivalent circuit model 60 of the battery cell 30. For example, if the battery cell 30 has a temperature value equal to Temp1, and a state-of-charge value equal to SOC2, the microprocessor 42 would extract a time constant value R1C1_2 from the table 430. It is noted that the time constant values stored in the R1C1 charge table 430 are empirically determined before use of the table 430.

Referring to FIG. 16, the R2C2 charge table 440 has time constant values associated with the parallel combination of the resistor 82 and the capacitor 92 in the battery cell equivalent circuit model 60 (shown in FIG. 2), while charging the battery cell 30. The R2C2 charge table 440 utilizes a temperature value of the battery cell 30 and a state-of-charge value of the battery cell 30 as indexes in the table 440 for retrieving time constant values associated with the parallel combination of the resistor 82 and the capacitor 92 in the battery cell equivalent circuit model 60 of the battery cell 30. For example, if the battery cell 30 has a temperature value equal to Temp1, and a state-of-charge value equal to SOC2, the microprocessor 42 would extract a time constant value R2C2_2 from the table 440. It is noted that the time constant values stored in the R2C2 charge table 440 are empirically determined before use of the table 440.

Referring to FIG. 17, the R3C3 charge table 450 has time constant values associated with the parallel combination of the resistor 83 and the capacitor 93 in the battery cell equivalent circuit model 60 (shown in FIG. 2), while charging the battery cell 30. The R3C3 charge table 450 utilizes a temperature value of the battery cell 30 and a state-of-charge value of the battery cell 30 as indexes in the table 450 for retrieving time constant values associated with the parallel combination of the resistor 83 and the capacitor 93 in the battery cell equivalent circuit model 60 of the battery cell 30. For example, if the battery cell 30 has a temperature value equal to Temp1, and a state-of-charge value equal to SOC2, the microprocessor 42 would extract a time constant value R3C3_2 from the table 450. It is noted that the time constant values stored in the R3C3 charge table 450 are empirically determined before use of the table 450.

Referring to FIGS. 1, 2 and 18-22, a flowchart of a method for determining a discharge power limit value and a charge power limit value of a battery cell 30 in accordance with another exemplary embodiment will now be described.

At step 600, the current sensor 32 generates a first signal having a current value (I) therein. The current value (I) indicates a current level flowing through the battery cell 30 at a first time. After step 600, the method advances to step 602.

At step 602, the microprocessor 42 receives the first signal having the current value (I) therein. After step 602, the method advances to step 604.

At step 604, the voltage sensor 36 generates a second signal having a voltage value (Vcell) therein. The voltage value (Vcell) indicates a voltage measured across the battery cell 30 at the first time. After step 604, the method advances to step 606.

At step 606, the microprocessor 42 receives the second signal having the voltage value (Vcell) therein. After step 606, the method advances to step 608.

At step 608, the temperature sensor 38 generates a third signal having a cell temperature value (Temp) therein. The cell temperature value (Temp) indicates a temperature level of the battery cell 30 at the first time. After step 608, the method advances to step 610.

At step 610, the microprocessor 42 receives the third signal having the cell temperature value (Temp) therein. After step 610, the method advances to step 612.

At step 612, the microprocessor 42 determines a state-of-charge value (SOC) of the battery cell 30 utilizing the following equation: SOC=f(Vcell, I, Temp, Time), wherein f corresponds to a function adapted to calculate the state-of-charge value. After step 612, the method advances to step 614.

At step 614, the microprocessor 42 calculates a maximum allowed voltage drop value (maximum_allowed_voltage_drop) corresponding to a difference between a voltage measured across the battery cell 30 (Vcell) at the first time and a minimum allowed voltage measured across the battery cell 30 (Vmin_allowed), utilizing the following equation: maximum_allowed_voltage_drop=Vcell−Vmin_allowed. After step 614, the method advances to step 630.

At step 630, the microprocessor 42 calculates a first current level (I_required_discharge_current) through the battery cell 30 for N seconds (e.g., predetermined amount of time) that is required to obtain the maximum allowed voltage drop value at a future time N seconds after the first time, utilizing the following equation:

I_required_discharge_current=(maximum_allowed_voltage_drop/(R0+(predictive_saturation_ratio_value*(R1+R2+R3))))+I; wherein $$\text{predictive\_saturation\_ratio\_value} = \frac{R1\left(1 - e^{\left(\frac{-Nsec}{R1C1}\right)}\right) + R2\left(1 - e^{\left(\frac{-NSec}{R2C2}\right)}\right) + R3\left(1 - e^{\left(\frac{-NSec}{R3C3}\right)}\right)}{R1 + R2 + R3}$$

wherein R0 corresponds to an ohmic resistance of a resistor in the battery cell equivalent circuit model shown in FIG. 2, obtained from the table 190 (shown in FIG. 4);

R1 corresponds to a resistance component of a time varying impedance associated with a first RC pair stage of the battery cell equivalent circuit model shown in FIG. 2, obtained from the table 200 (shown in FIG. 5);

R2 corresponds to a resistance component of a time varying impedance associated with a second RC pair stage of the battery cell equivalent circuit model shown in FIG. 2, obtained from the table 210 (shown in FIG. 6);

R3 corresponds to a resistance component of a time varying impedance associated with a third RC pair stage of the battery cell equivalent circuit model shown in FIG. 2, obtained from the table 220 (shown in FIG. 7);

R1C1 is a time constant (e.g., a time period at which a voltage drop across the RC pair stage reaches 63.2% of its final value) of the first RC pair stage of the battery cell equivalent circuit model shown in FIG. 2, obtained from the table 230 (shown in FIG. 8);

R2C2 is a time constant (e.g., a time period at which a voltage drop across the RC pair stage reaches 63.2% of its final value) of the second RC pair stage of the battery cell equivalent circuit model shown in FIG. 2, obtained from the table 240 (shown in FIG. 9);

R3C3 is a time constant (a time period at which a voltage drop across the RC pair stage reaches 63.2% of its final value) of the third RC pair stage of the battery cell equivalent circuit model shown in FIG. 2, obtained from the table 250 (shown in FIG. 10); and Nsec corresponds to a number of seconds (e.g., N seconds) of forward prediction time that the I_required_discharge_current is being calculated for.

After step 630, the method advances to step 632. At step 632, the microprocessor 42 makes a determination as to whether I_required_discharge_current is less than or equal to I_max_allowed_discharge current, wherein I_max_allowed_discharge_current is a maximum allowed discharge current drawn from the battery cell 30. If the value step 632 equals "yes", the method advances to step 634. Otherwise, the method advances to step 650.

At step 634, the microprocessor 42 calculates a first discharge power limit value (discharge_power_limit) that can be expected from the battery cell 30 continuously for N seconds without the voltage measured across the battery cell 30 falling below Vmin_allowed, utilizing the following equation:

discharge_power_limit=I_required_discharge_current*Vmin_allowed. After step 634, the method advances to step 636.

At step 636, the microprocessor 42 stores the first discharge power limit value (discharge_power_limit) in the memory device 130. After step 636, the method advances to step 650.

At step 650, the microprocessor 42 makes a determination as to whether I_required_discharge_current is greater than I_max_allowed_discharge_current. If the value of step 650 equals "yes", the method advances to step 652. Otherwise, the method advances to step 656.

At step 652, the microprocessor 42 calculates a second discharge power limit value that can be expected from the battery cell 30 continuously for N seconds without exceeding I_max_allowed_discharge_current, utilizing the following equation:

discharge_power_limit=I_max_allowed_discharge_current*(Vcell−I_max_allowed_discharge_current*(R1+(R1+R2+R3)*predictive_saturation_ratio_value)); wherein $$\text{predictive\_saturation\_ratio\_value} = \frac{R1\left(1 - e^{\left(\frac{-Nsec}{R1C1}\right)}\right) + R2\left(1 - e^{\left(\frac{NSec}{R2C2}\right)}\right) + R3\left(1 - e^{\left(\frac{-NSec}{R3C3}\right)}\right)}{R1 + R2 + R3}$$

wherein R0 corresponds to an ohmic resistance of a resistor in the battery cell equivalent circuit model shown in FIG. 2, obtained from the table 190 (shown in FIG. 4);

R1 corresponds to a resistance component of a time varying impedance associated with a first RC pair stage of the battery cell equivalent circuit model shown in FIG. 2, obtained from the table 200 (shown in FIG. 5);

R2 corresponds to a resistance component of a time varying impedance associated with a second RC pair stage of the battery cell equivalent circuit model shown in FIG. 2, obtained from the table 210 (shown in FIG. 6);

R3 corresponds to a resistance component of a time varying impedance associated with a third RC pair stage of the battery cell equivalent circuit model shown in FIG. 2, obtained from the table 220 (shown in FIG. 7);

R1C1 is a time constant (e.g., a time period at which a voltage drop across the RC pair stage reaches 63.2% of its final value) of the first RC pair stage of the battery cell equivalent circuit model shown in FIG. 2, obtained from the table 230 (shown in FIG. 8);

R2C2 is a time constant (e.g., a time period at which a voltage drop across the RC pair stage reaches 63.2% of its final value) of the second RC pair stage of the battery cell equivalent circuit model shown in FIG. 2, obtained from the table 240 (shown in FIG. 9);

R3C3 is a time constant (a time period at which a voltage drop across the RC pair stage reaches 63.2% of its final value) of the third RC pair stage of the battery cell equivalent circuit model shown in FIG. 2, obtained from the table 250 (shown in FIG. 10); and Nsec corresponds to a number of seconds (e.g., N seconds) of forward prediction time that the discharge_power_limit is being calculated for.

After step 652, the method advances to step 654. At step 654, the microprocessor 42 stores the second discharge power limit value (discharge_power_limit) in the memory device 130. After step 654, the method advances to step 656.

At step 656, the microprocessor 42 calculates a maximum allowed voltage gain value (maximum_allowed_voltage_gain) corresponding to a difference between a voltage measured across the battery cell 30 at the first time (Vcell) and a maximum allowed voltage measured across the battery cell 30 (Vmax_allowed), utilizing the following equation: maximum_allowed_voltage_gain=Vmax_allowed−Vcell. After step 656, the method advances to step 670.

At step 670, the microprocessor 42 calculates a second current level (I_required_charge_current) into the battery cell 30 for N seconds (Nsec) that is required to obtain the maximum allowed voltage gain value at a future time N seconds after the first time, utilizing the following equation:

I_required_charge_current=(maximum_allowed_voltage_gain/(R0+(predictive_saturation_ratio_value*(R1+R2+R3))))+I; wherein $$\text{predictive\_saturation\_ratio\_value} = \frac{R1\left(1 - e^{\left(\frac{-Nsec}{R1C1}\right)}\right) + R2\left(1 - e^{\left(\frac{NSec}{R2C2}\right)}\right) + R3\left(1 - e^{\left(\frac{-NSec}{R3C3}\right)}\right)}{R1 + R2 + R3}$$

wherein R0 corresponds to an ohmic resistance of a resistor in the battery cell equivalent circuit model shown in FIG. 2, obtained from the table 390 (shown in FIG. 11);

R1 corresponds to a resistance component of a time varying impedance associated with a first RC pair stage of the battery cell equivalent circuit model shown in FIG. 2, obtained from the table 400 (shown in FIG. 12);

R2 corresponds to a resistance component of a time varying impedance associated with a second RC pair stage of the battery cell equivalent circuit model shown in FIG. 2, obtained from the table 410 (shown in FIG. 13);

R3 corresponds to a resistance component of a time varying impedance associated with a third RC pair stage of the battery cell equivalent circuit model shown in FIG. 2, obtained from the table 420 (shown in FIG. 14);

R1C1 is a time constant (e.g., a time period at which a voltage drop across the RC pair stage reaches 63.2% of its final value) of the first RC pair stage of the battery cell equivalent circuit model shown in FIG. 2, obtained from the table 430 (shown in FIG. 15);

R2C2 is a time constant (e.g., a time period at which a voltage drop across the RC pair stage reaches 63.2% of its final value) of the second RC pair stage of the battery cell equivalent circuit model shown in FIG. 2, obtained from the table 440 (shown in FIG. 16);

R3C3 is a time constant (a time period at which a voltage drop across the RC pair stage reaches 63.2% of its final value) of the third RC pair stage of the battery cell equivalent circuit model shown in FIG. 2, obtained from the table 450 (shown in FIG. 17); and Nsec corresponds to a number of seconds (N seconds) of forward prediction time that the I_required_charge_current is being calculated for.

After step 670, the method advances to step 672. At step 672, the microprocessor 42 makes a determination as to whether I_required_charge current is less than or equal to I_max_allowed_charge_current, wherein I_max_allowed_charge_current is a maximum allowed charge current that may be fed into the battery cell 30. If the value of step 672 equals "yes", the method advances to step 674. Otherwise, the method advances to step 690.

At step 674, the microprocessor 42 calculates a first charge power limit value (charge_power_limit) that can be provided to the battery cell 30 continuously for N seconds without the voltage measured across the battery cell 30 rising above Vmax_allowed, utilizing the following equation: charge_power_limit=I_required charge_current * Vmin_allowed. After step 674, the method advances to step 676.

At step 676, the microprocessor 42 stores the first charge power limit value (charge_power_limit) in the memory device 130. After step 676, the method advances to step 690.

At step 690, the microprocessor 42 makes a determination as to whether I_required charge_current is greater than I_max_allowed_charge_current. If the value of step 690 equals "yes", the method advances to step 692. Otherwise, the method is exited.

At step 692, the microprocessor 42 calculates a second charge power limit value (charge_power_limit) that can be pushed into the battery cell 30 continuously for N seconds without exceeding I_max_allowed_charge_current, utilizing the following equation:

charge_power_limit =I_max_allowed_charge current * (Vcell +I_max_allowed_charge_current*(R0+(R1+R2+R3)*predictive_saturation_ratio_value)); wherein $$\text{predictive\_saturation\_ratio\_value} = \frac{R1\left(1 - e^{\left(\frac{-Nsec}{R1C1}\right)}\right) + R2\left(1 - e^{\left(\frac{NSec}{R2C2}\right)}\right) + R3\left(1 - e^{\left(\frac{-NSec}{R3C3}\right)}\right)}{R1 + R2 + R3}$$

wherein R0 corresponds to an ohmic resistance of a resistor in the battery cell equivalent circuit model shown in FIG. 2, obtained from the table 390 (shown in FIG. 11);

R1 corresponds to a resistance component of a time varying impedance associated with a first RC pair stage of the battery cell equivalent circuit model shown in FIG. 2, obtained from the table 400 (shown in FIG. 12);

R2 corresponds to a resistance component of a time varying impedance associated with a second RC pair stage of the battery cell equivalent circuit model shown in FIG. 2, obtained from the table 410 (shown in FIG. 13);

R3 corresponds to a resistance component of a time varying impedance associated with a third RC pair stage of the battery cell equivalent circuit model shown in FIG. 2, obtained from the table 420 (shown in FIG. 14);

R1C1 is a time constant (e.g., a time period at which a voltage drop across the RC pair stage reaches 63.2% of its final value) of the first RC pair stage of the battery cell equivalent circuit model shown in FIG. 2, obtained from the table 430 (shown in FIG. 15);

R2C2 is a time constant (e.g., a time period at which a voltage drop across the RC pair stage reaches 63.2% of its final value) of the second RC pair stage of the battery cell equivalent circuit model shown in FIG. 2, obtained from the table 440 (shown in FIG. 16);

R3C3 is a time constant (a time period at which a voltage drop across the RC pair stage reaches 63.2% of its final value) of the third RC pair stage of the battery cell equivalent circuit model shown in FIG. 2, obtained from the table 450 (shown in FIG. 17); and Nsec corresponds to a number of seconds (N seconds) of forward prediction time that the charge_power_limit is being calculated for.

After step 692, the method advances to step 694. At step 694, the microprocessor 42 stores the second charge power limit value (charge_power_limit) in the memory device 130. After step 694, the method advances to step 696.

At step 696, the microprocessor 42 sends the charge_power_limit and the discharge_power_limit to an external computer 43. After step 696, the method advances to step 698.

At step 698, the external computer 43 controls the load 34 such that an amount of power drawn from the battery cell 30 by the load 34 does not ever exceed the discharge_power_limit in magnitude or hold the discharge_power_limit for more than N seconds. After step 698, the method advances to step 700.

At step 700, the external computer 43 controls the charging circuit 40 such that an amount of power supplied to the battery cell 30 does not ever exceed the charge_power_limit in magnitude or hold the charge_power_limit for more than N seconds. After step 700, the method is exited.

The above-described method can be at least partially embodied in the form of one or more memory devices or computer readable media having computer-executable instructions for practicing the methods. The memory devices can comprise one or more of the following: hard drives, RAM memory, flash memory, and other computer-readable media known to those skilled in the art; wherein, when the computer-executable instructions are loaded into and executed by one or more microprocessors or computers, the one or more microprocessors or computers become an apparatus programmed to practice the associated steps of the method.

The system and the method described herein provide a substantial advantage over other systems and methods. In particular, the system calculates a predictive saturation ratio value based on an ohmic resistance value and time-varying resistance values of a battery cell equivalent circuit model of the battery cell, which is used to accurately determine a discharge power limit value of the battery cell, and to determine the charge power limit value of the battery cell.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining a discharge power limit value of a battery cell, comprising:
   a current sensor generating a first signal having a first value therein, the first value indicating a current level flowing through the battery cell at a first time;
   a microprocessor programmed to receive the first signal having the first current value therein;
   the microprocessor further programmed to calculate a maximum allowed voltage drop value corresponding to a difference between a voltage measured across the battery cell at the first time and a minimum allowed voltage of the battery cell;
   the microprocessor further programmed to calculate a first current level through the battery cell for a predetermined amount of time that is required to obtain the maximum allowed voltage drop value, based on a first ohmic resistance value of a battery cell equivalent circuit model of the battery cell, a first predictive saturation ratio value, at least a first time-varying resistance value of the battery cell equivalent circuit model of the battery cell, and the first current value;
   the microprocessor further programmed to calculate a first discharge power limit value that indicates an amount of power that can be expected from the battery cell continuously for the predetermined amount of time without the voltage measured across the battery cell falling below the minimum allowed voltage of the battery cell, if the first current level is less than or equal to a maximum allowed discharge current of the battery cell; the first discharge power limit value being based on the first current level and the minimum allowed voltage of the battery cell; and the microprocessor further programmed to calculate a second discharge power limit value that indicates the amount of power that can be expected from the battery cell continuously for the predetermined amount of time without exceeding the maximum allowed discharge current, if the first current level is greater than the maximum allowed discharge current of the battery cell; the second discharge power limit value being based on the maximum allowed discharge current of the battery cell, the voltage measured across the battery cell at the first time, the maximum allowed discharge current of the battery cell, the first ohmic resistance value of the battery cell equivalent circuit model of the battery cell, the first time-varying resistance value of the battery cell equivalent circuit model of the battery cell, and the first predictive saturation ratio value.

2. The system of claim 1, wherein the microprocessor further programmed to store the first discharge power limit value in the memory device, if the first current level is less than or equal to the maximum allowed discharge current of the battery cell.

3. The system of claim 1, wherein the microprocessor further programmed to store the second discharge power limit value in the memory device, if the first current level is greater than the maximum allowed discharge current of the battery cell.

4. The system of claim 1, wherein the microprocessor is further programmed to calculate the first predictive saturation ratio value based on the first time-varying resistance value of the battery cell equivalent circuit model of the battery cell, a first time constant value of the battery cell equivalent circuit model of the battery cell, and the predetermined amount of time; the first time-varying resistance value and the first time constant value of the battery cell equivalent circuit model of the battery cell being associated with a first temperature value of the battery cell and a first state-of-charge value of the battery cell.

5. The system of claim 1, wherein the microprocessor further programmed to calculate the first current level from the battery cell based on second and third time-varying resistance values and second and third time constant values of the battery cell equivalent circuit model of the battery cell.

6. The system of claim 1, wherein the microprocessor is further programmed to calculate the first predictive saturation ratio value based on the first time-varying resistance value and second and third time-varying resistance values of the battery cell equivalent circuit model of the battery cell, and first, second, and third time constant values of the battery cell equivalent circuit model of the battery cell, and the predetermined amount of time; each of the first, second, and third time-varying resistance values and the first, second, and third time constant values being associated with a first temperature value of the battery cell and a first state-of-charge value of the battery cell.

7. The system of claim 1, further comprising:
a voltage sensor generating a second signal having a voltage value therein, the voltage value indicating the voltage measured across the battery cell at the first time; and
the microprocessor further programmed to receive the second signal having the voltage value therein.

8. A system for determining a charge power limit value of a battery cell, comprising:
a current sensor generating a first signal having a current value therein, the current value indicating a current level flowing through the battery cell at a first time;
a microprocessor programmed to receive the first signal having the first current value therein;
the microprocessor further programmed to calculate a maximum allowed voltage gain value corresponding to a difference between a voltage measured across the battery cell at the first time and a maximum allowed voltage of the battery cell;
the microprocessor further programmed to calculate a first current level through the battery cell for a predetermined amount of time that is required to obtain the maximum allowed voltage gain value, based on a first ohmic resistance value of a battery cell equivalent circuit model of the battery cell, a first predictive saturation ratio value, at least a first time-varying resistance value of the battery cell equivalent circuit model of the battery cell, and the first current value;
the microprocessor further programmed to calculate a first charge power limit value that indicates an amount of power that can be provided the battery cell continuously for the predetermined amount of time without the voltage measured across the battery cell exceeding the maximum allowed voltage of the battery cell, if the first current level is less than or equal to a maximum allowed charge current of the battery cell; the first charge power limit value being based on the first current level and the maximum allowed voltage of the battery cell; and
the microprocessor further programmed to calculate a second charge power limit value that indicates the amount of power that can be provided to the battery cell continuously for the predetermined amount of time without exceeding the maximum allowed charge current, if the first current level is greater than the maximum allowed charge current of the battery cell; the second charge power limit value being based on the maximum allowed charge current of the battery cell, the voltage measured across the battery cell at the first time, the maximum allowed charge current of the battery cell, the first ohmic resistance value of the battery cell equivalent circuit model of the battery cell, the first time-varying resistance value of the battery cell equivalent circuit model of the battery cell, and the first predictive saturation ratio value.

9. The system of claim 8, wherein the microprocessor further programmed to store the first charge power limit value in the memory device, if the first current level is less than or equal to the maximum allowed charge current of the battery cell.

10. The system of claim 8, wherein the microprocessor further programmed to store the second charge power limit value in the memory device, if the first current level is greater than the maximum allowed charge current of the battery cell.

11. The system of claim 8, wherein the microprocessor is further programmed to calculate the first predictive saturation ratio value based on the first time-varying resistance value of the battery cell equivalent circuit model of the battery cell, a first time constant value of the battery cell equivalent circuit model of the battery cell, and the predetermined amount of time; the first time-varying resistance value and the first time constant value being associated with a first temperature value of the battery cell and a first state-of-charge value of the battery cell.

12. The system of claim 8, wherein the microprocessor further programmed to calculate the first current level based on second and third time-varying resistance values and the second and third time constant values of the battery cell equivalent circuit model of the battery cell.

13. The system of claim 8, wherein the microprocessor is further programmed to calculate the first predictive saturation ratio value based on the first time-varying resistance value of the battery cell and second and third time-varying resistance values of the battery cell equivalent circuit model of the battery cell, and first, second, and third time constant values of the battery cell equivalent circuit model of the battery cell, and the predetermined amount of time; each of the first, second, and third time-varying resistance values and the first, second, and third time constant values being associated with a first temperature value of the battery cell and a first state-of-charge value of the battery cell.

14. The system of claim 8, further comprising:
a voltage sensor generating a second signal having a voltage value therein, the voltage value indicating the voltage measured across the battery cell at the first time; and
the microprocessor further programmed to receive the second signal having the voltage value therein.

* * * * *